US007183126B2

(12) United States Patent
Lin

(10) Patent No.: US 7,183,126 B2
(45) Date of Patent: Feb. 27, 2007

(54) METHOD FOR FORMING AN OPTICAL INTERFERING PATTERN ON A SURFACE OF A METAL SUBSTRATE, AND ARTICLE HAVING AN OPTICAL INTERFERING EFFECT

(75) Inventor: Yeh-Huang Lin, Tu-Cheng (TW)

(73) Assignee: Pro Magnus Technology Corp., Taipei (TW)

( * ) Notice: Subject to any disclaimer, the term of this patent is extended or adjusted under 35 U.S.C. 154(b) by 208 days.

(21) Appl. No.: 10/869,255

(22) Filed: Jun. 16, 2004

(65) Prior Publication Data

US 2005/0161428 A1 Jul. 28, 2005

(30) Foreign Application Priority Data

Jan. 28, 2004 (TW) ................................ 93101849

(51) Int. Cl.
*H01L 21/00* (2006.01)

(52) U.S. Cl. ........................................ 438/29

(58) Field of Classification Search ................ 438/555, 438/29; 430/394; 29/600
See application file for complete search history.

(56) References Cited

U.S. PATENT DOCUMENTS 6,218,090 B1 * 4/2001 Minter et al. ............... 430/394
6,363,605 B1 * 4/2002 Shih et al. .................... 29/600
6,605,519 B2 * 8/2003 Lishan ....................... 438/555

* cited by examiner

*Primary Examiner*—Carl Whitehead, Jr.
*Assistant Examiner*—Monica D. Harrison
(74) *Attorney, Agent, or Firm*—Ladas & Parry LLP

(57) ABSTRACT

An article having an optical interfering effect includes a metal substrate with a surface, and a pattern of micro-cavities formed on the surface of the metal substrate and exhibiting an optical interfering effect on the reflection of the pattern of the micro-cavities. Each of the micro-cavities is indented inwardly from the surface of the metal substrate, and has a concave cross-section. A method for forming the pattern of the micro-cavities on the surface of the metal substrate is also disclosed.

11 Claims, 6 Drawing Sheets

METHOD FOR FORMING AN OPTICAL INTERFERING PATTERN ON A SURFACE OF A METAL SUBSTRATE, AND ARTICLE HAVING AN OPTICAL INTERFERING EFFECT

CROSS-REFERENCE TO RELATED APPLICATION

This application claims priority of Taiwanese application no. 093101849, filed on Jan. 28, 2004.

BACKGROUND OF THE INVENTION

1. Field of the Invention

This invention relates to a method for forming a pattern on a surface of a metal substrate, more particularly to a method for forming an optical interfering pattern on a surface of a metal substrate. This invention also relates to an article having a pattern of micro-cavities, more particularly to an article having a pattern of micro-cavities that exhibits an optical interfering effect on reflection of the pattern of micro-cavities.

2. Description of the Related Art

Up to now, a light-reflecting pattern with an optical interfering effect is formed by forming a plurality of cavities on a surface of a metal substrate using a cutting tool, such as a diamond cutter. The cavities formed on the surface of the metal substrate are subsequently subjected to electroplating or anodic treatment so as to improve the light-reflecting effect or durability. However, when the width of the cavities is required to be in a level of hundreds of micrometers (μm), as shown in FIGS. 1 and 2, the conventional method for forming cavities on the metal substrates by using the cutting tool is merely capable of forming a pattern of parallel straight lines or concentric circles of cavities that have a V-shaped cross-section 9. A more complicated pattern compared to those shown in FIGS. 1 and 2 cannot be achieved using the conventional method. Therefore, when the conventional method using the cutting tool is applied to form a pattern having an optical interfering effect, the application and variation of the pattern thus formed is limited, and the optical interfering effect on the light reflection of the pattern occurs only within a small angle by virtue of the V-shaped cross-section 9 of each cavity.

As for the optical interfering pattern useful for anti-counterfeiting, such as rainbow halograms, which is widely used in different applications, such as credit cards, it is formed by printing and transferring techniques. Generally, such pattern is formed by the steps of: imaging the pattern having the desired optical information on a photographic film so as to form a rainbow halogram film, applying a photoresist material on the rainbow halogram film, patterning the photoresist material through exposure and developing using a laser, electroplating a nickel layer on the photoresist material and then removing the photoresist material so as to form a pressing mold, impressing the pressing mold on a transparent plastic film so as to pattern the transparent plastic film, coating the patterned transparent plastic film with an aluminum layer, and attaching the aluminum layer together with the patterned transparent plastic film to a plastic substrate. The desired optical information included in the pattern can be expressed when light is transmitted into the transparent film and is reflected by the aluminum layer.

In the abovementioned method for forming an optical interfering pattern using a rainbow halogram film, the steps involved are complicated. Moreover, the electroplating is limited to certain materials, the manufacturing cost is high, and the productivity is low. Besides, the optical interfering pattern is not directly formed on the substrate, and is instead indirectly attached to the substrate through an adhesive, which adversely affects the appearance of the resultant product, and which reduces the service life and application of the resultant product.

SUMMARY OF THE INVENTION

Therefore, the object of this invention is to provide a method for forming an optical interfering pattern on a surface of a metal substrate, and an article having an optical interfering effect so as to overcome the aforesaid drawbacks of the prior art.

According to one aspect of the present invention, a method for forming an optical interfering pattern on a surface of a metal substrate includes the steps of: (a) patterning the surface of the metal substrate using a mask to identify areas of a pattern of micro-cavities to be etched using photolithography techniques; and (b) wet-etching the metal substrate at the areas of the pattern of the micro-cavities to be etched so as to form the pattern of the micro-cavities, that exhibits an optical interfering effect on the reflection of the pattern of the micro-cavities, in the metal substrate.

According to another aspect of the present invention, an article having the pattern of the micro-cavities formed by the abovementioned method is also provided.

According to yet another aspect of the present invention, an article having an optical interfering effect includes: a metal substrate with a surface; and a pattern of micro-cavities formed on the surface of the metal substrate and exhibiting an optical interfering effect on the reflection of the pattern. Each of the micro-cavities is indented inwardly from the surface of the metal substrate, and has a concave cross-section.

BRIEF DESCRIPTION OF THE DRAWINGS

Other features and advantages of the present invention will become apparent in the following detailed description of the preferred embodiments of the invention, with reference to the accompanying drawings. In the drawings.

DETAILED DESCRIPTION OF THE PREFERRED EMBODIMENTS

Figure 1:
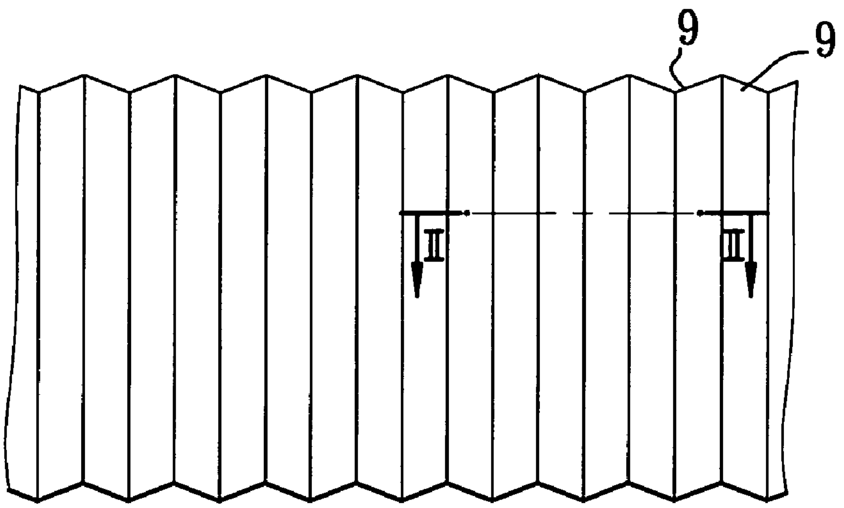
F I G. 1 PRIOR ART
FIG. 1 is a schematic view to illustrate a pattern of cavities that are formed on a metal substrate by a conventional method.
Figure 2:
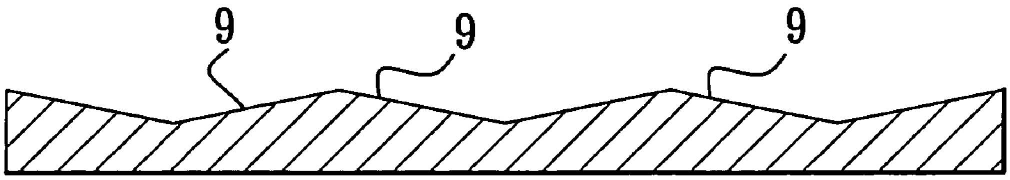
F I G. 2 PRIOR ART
FIG. 2 is a schematic cross-sectional view taken along the line II—II in FIG. 1 to illustrate the shape of the cavities shown in FIG. 1.
Figure 3:
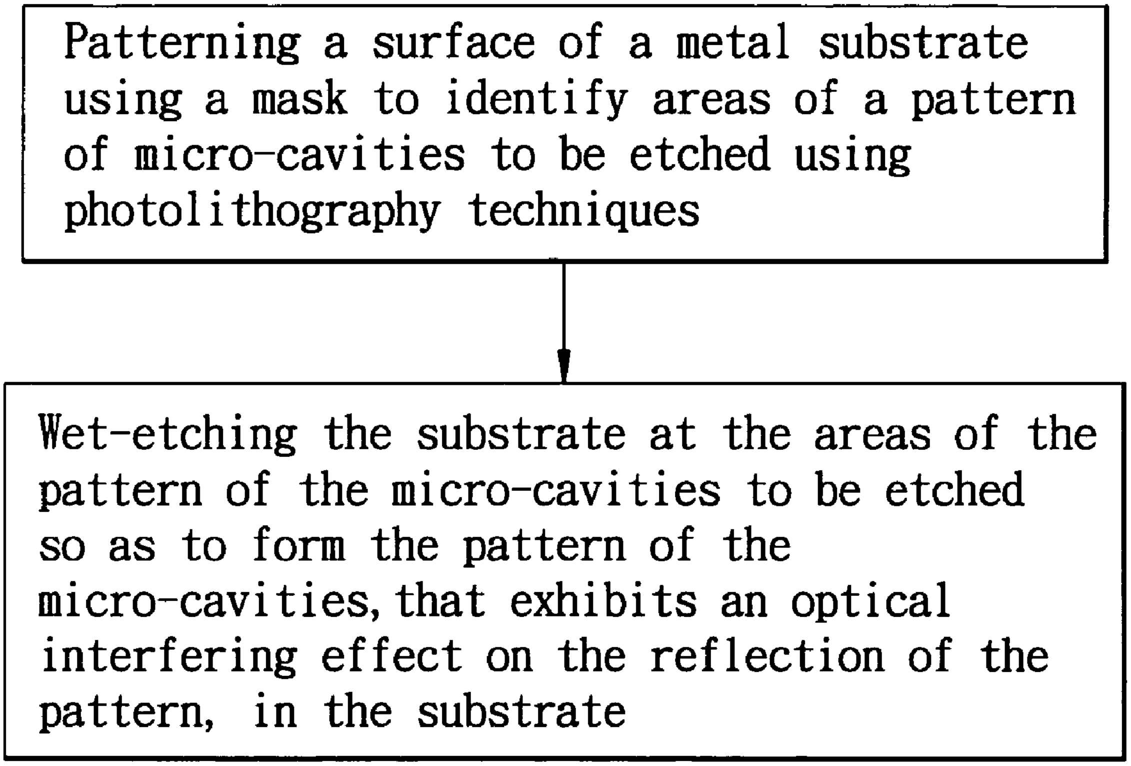
FIG. 3 is a flow chart to illustrate consecutive steps of the preferred embodiment of a method for forming an optical interfering pattern on a surface of a metal substrate according to the present invention.
Figure 4:
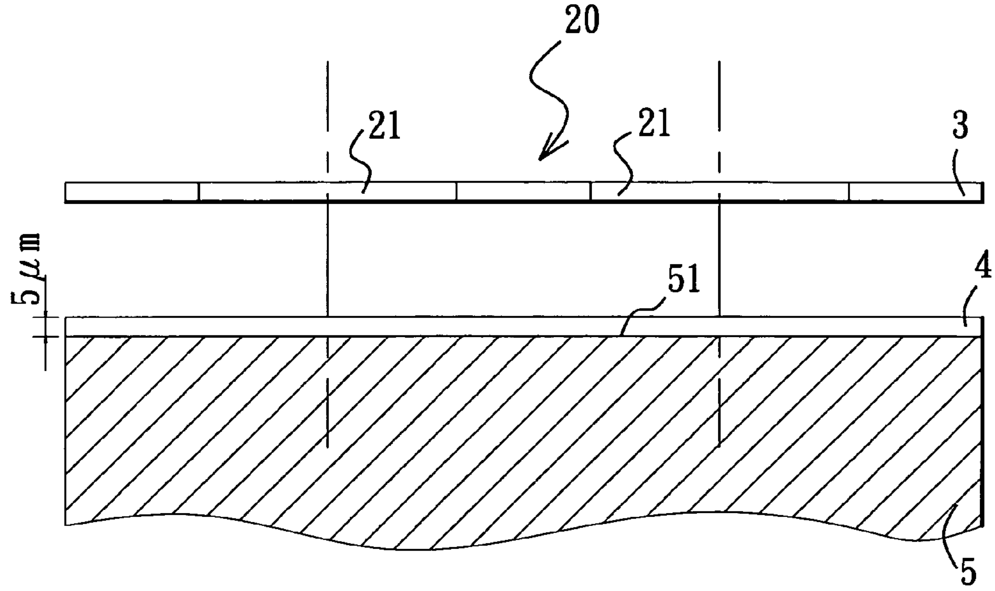
FIGS. 4 and 5 are schematic cross-sectional views to illustrate the patterning operation for defining areas of a pattern of micro-cavities on the surface of the metal substrate through photolithography techniques in the method according to the present invention.

FIGS. 3 to 8 illustrate consecutive steps of a preferred embodiment of a method for forming an optical interfering pattern on a surface of a metal substrate according to the present invention. Referring to FIG. 3, the method includes the steps of: (a) patterning the surface 51 of the metal substrate 5 using a mask 3 to identify areas 41 of a pattern of micro-cavities 511 to be etched using photolithography techniques; and (b) wet-etching the metal substrate 5 at the areas 41 of the pattern of the micro-cavities 511 to be etched so as to form the pattern of the micro-cavities 511, that exhibits an optical interfering effect on the reflection of the pattern, in the metal substrate 5. In step (a), as shown in FIG. 4, the mask 3 including a pattern 20 of a plurality of lines 21 is prepared, and a photoresist layer 4 is applied to the surface 51 of the metal substrate 5. Preferably, the surface 51 of the metal substrate 5 is pre-cleaned by acid cleaning before the application of the photoresist layer 4. The photoresist layer 4 has a predetermined thickness, preferably 5 μm, and is applied to the surface 51 of the metal substrate 5 by a scraping tool or a centrifuging apparatus.

Figure 5:
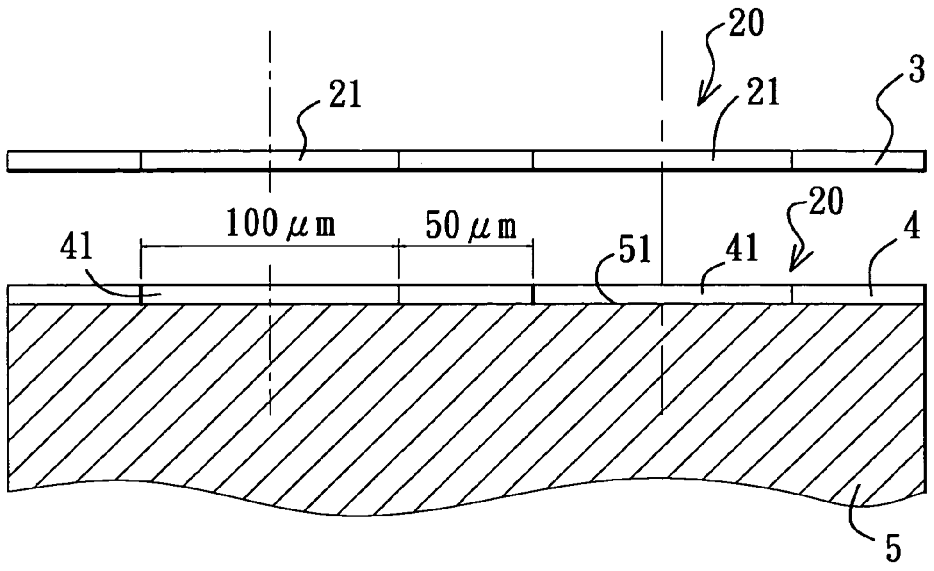

With further reference to FIG. 5, the pattern 20 of the plurality of lines 21 of the mask 3 is transferred to the photoresist layer 4 through photolithography techniques involving exposure and development operations, so as to identify areas 41 of a pattern of micro-cavities 511 to be etched on the surface 51 of the metal substrate 5.

Preferably, each of the micro-cavities 511 is elongated in shape, and has a width ranging from 15 to 200 μm. More preferably, the width of each micro-cavity 511 is 100 μm. Preferably, the distance between two adjacent ones of the micro-cavities 511 ranges from 30 to 250 μm. More preferably, the distance between two adjacent ones of the micro-cavities 511 is 50 μm.

Figure 6:
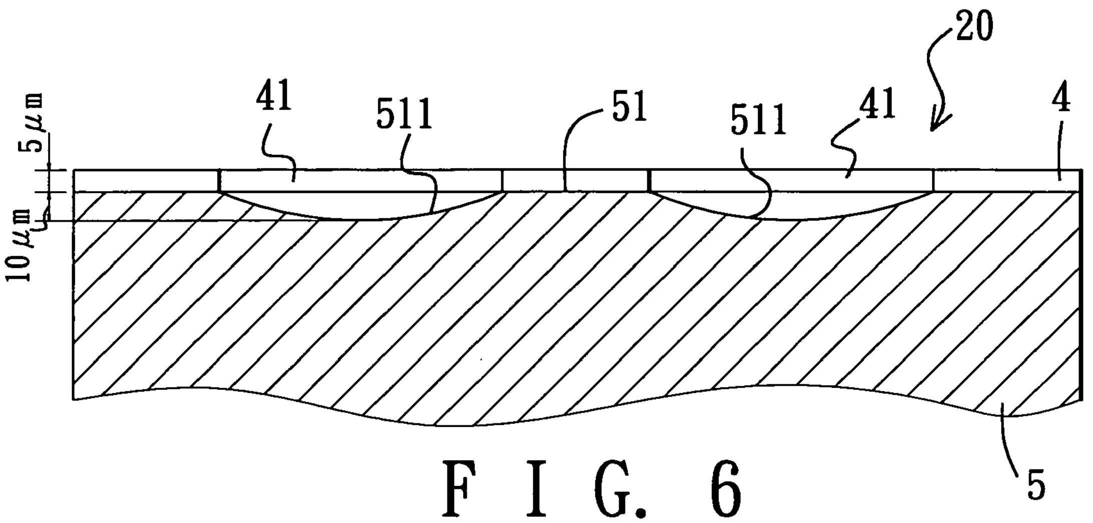
FIGS. 6 and 7 are schematic cross-sectional views to illustrate the wet-etching operation for forming the pattern of micro-cavities on the surface of the metal substrate in the method according to the present invention.

In step (b), as shown in FIG. 6, the surface 51 of the metal substrate 5 is wet-etched at the areas 41 of the pattern of the micro-cavities 511 to be etched that are exposed from the remainder of the photoresist layer 4, which serves as an etching barrier layer, so as to form the pattern of the micro-cavities 511. Preferably, each of the micro-cavities 511 has a depth less than half of the width thereof and greater than one-fifteenth of the width thereof. Most preferably, as in this embodiment, the depth of each micro-cavity 511 is 10 microns.

Figure 7:
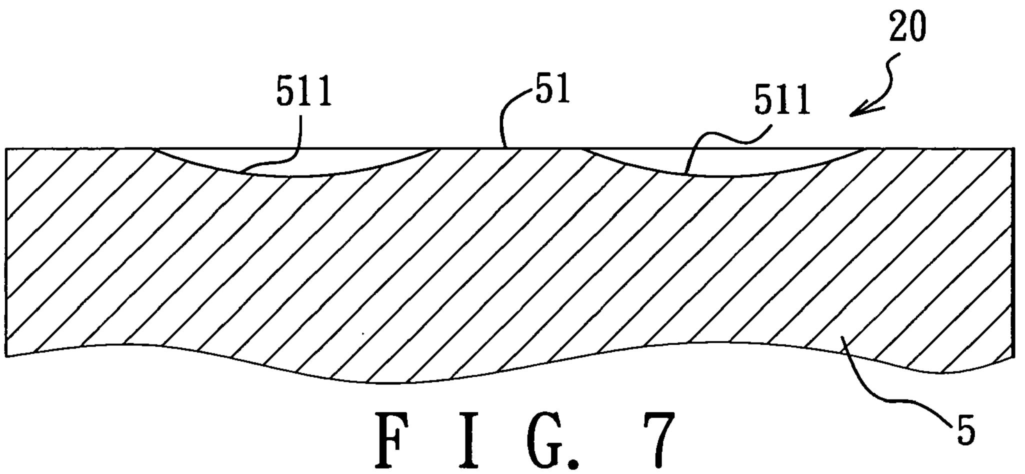

Referring to FIG. 7, the photoresist layer 4 is completely removed after the micro-cavities 511 are formed so as to completely expose the surface 51 of the metal substrate 5 where the micro-cavities 511 are formed.

Figure 8:
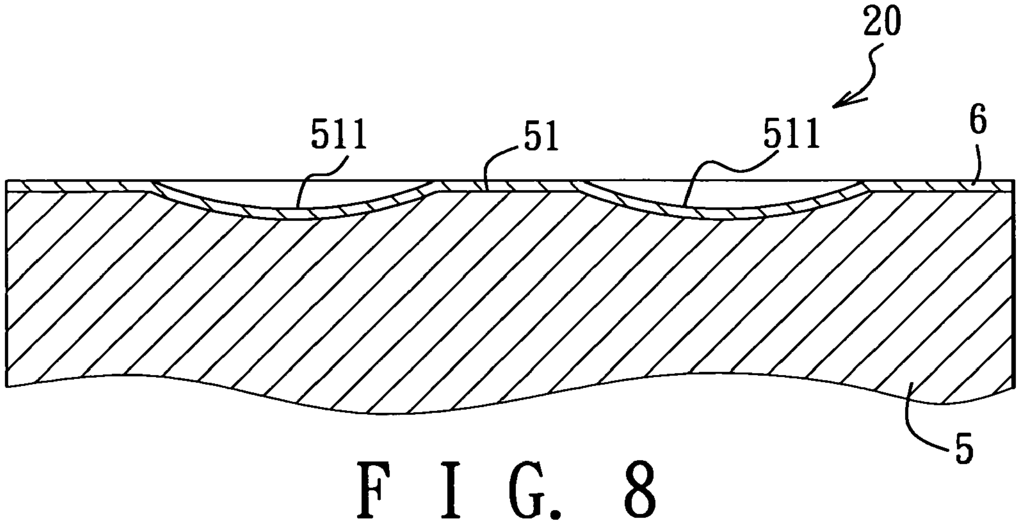
FIG. 8 is a schematic cross-sectional view to illustrate deposition of a reflection-enhancing metal layer on the surface of the metal substrate formed with the pattern of micro-cavities.

Optionally, a reflection-enhancing metal layer 6 may be deposited on the surface 51 of the metal substrate 5 through plating techniques, as shown in FIG. 8, so as to exhibit the optical interfering effect on the reflection of the pattern of micro-cavities 511 formed on the metal substrate 5.

The abovementioned method for forming an optical interfering pattern on a surface of a metal substrate according to this invention may be applied to a metal housing of a portable electronic device, such as an aluminum housing of a cellular phone. When the method according to this invention is applied to a metal substrate made from aluminum, the etchant used in the wet-etching operation of the surface 51 of the metal substrate 5 may be a ferric chloride solution having a specific gravity of 1.40. Selection of the etchant depends upon the metal substrate to be etched. However, the detailed descriptions regarding the suitable species of the metal substrate 5 are omitted herein since these are not pertinent to the technical features of this invention and can be readily appreciated by those skilled in the art.

It should be noted that the depth of each micro-cavity 511 is controlled by the type of etchant and the duration of the wet-etching operation. For example, in this embodiment, the wet-etching operation is conducted on a horizontal etching table of a 2 m production line (not shown). The free acid concentration of the etchant ranges from 2.5 M to 3 M, the etching temperature is controlled at about 50° C., and the transporting rate of the production line for conducting the wet-etching operation is set at 7 m/min. The etching time will vary with the species of the metal substrate 5 and the etchant used. For example, when the metal substrate 5 is made from copper or copper alloy, the ferric chloride solution having a specific gravity of 1.42 is used as the etchant, and the transporting rate of the production line for conducting the wet-etching operation is set at 4 m/min. Alternatively, when the metal substrate 5 is made from stainless steel, the ferric chloride solution having a specific gravity of 1.43 is used as the etchant, and the transporting rate of the production line for conducting the wet-etching operation is set at 3 m/min.

In addition to the optional deposition of the reflection-enhancing metal layer 6 on the surface 51 of the metal substrate 5 through plating techniques, so as to exhibit the optical interfering effect on the reflection of the pattern of micro-cavities 511, the surface 51 of the metal substrate 5 may be processed by a cathodic treatment or plated with other materials for increasing durability and resistance to corrosion. The detailed descriptions regarding the post-treatment of the metal substrate 5 after completing the wet-etching operation are omitted herein since these are not pertinent to the technical features of this invention and can be readily appreciated by those skilled in the art. It should be noted that in the method according to this invention, since the pattern of the micro-cavities 511 is formed by directly wet-etching the surface 51 of the metal substrate 5, any post-treatments suitable for metal surfaces can be directly applied thereto so as to enhance service life and broaden applications of the optical interfering pattern formed by the method of this invention.

Figure 9:
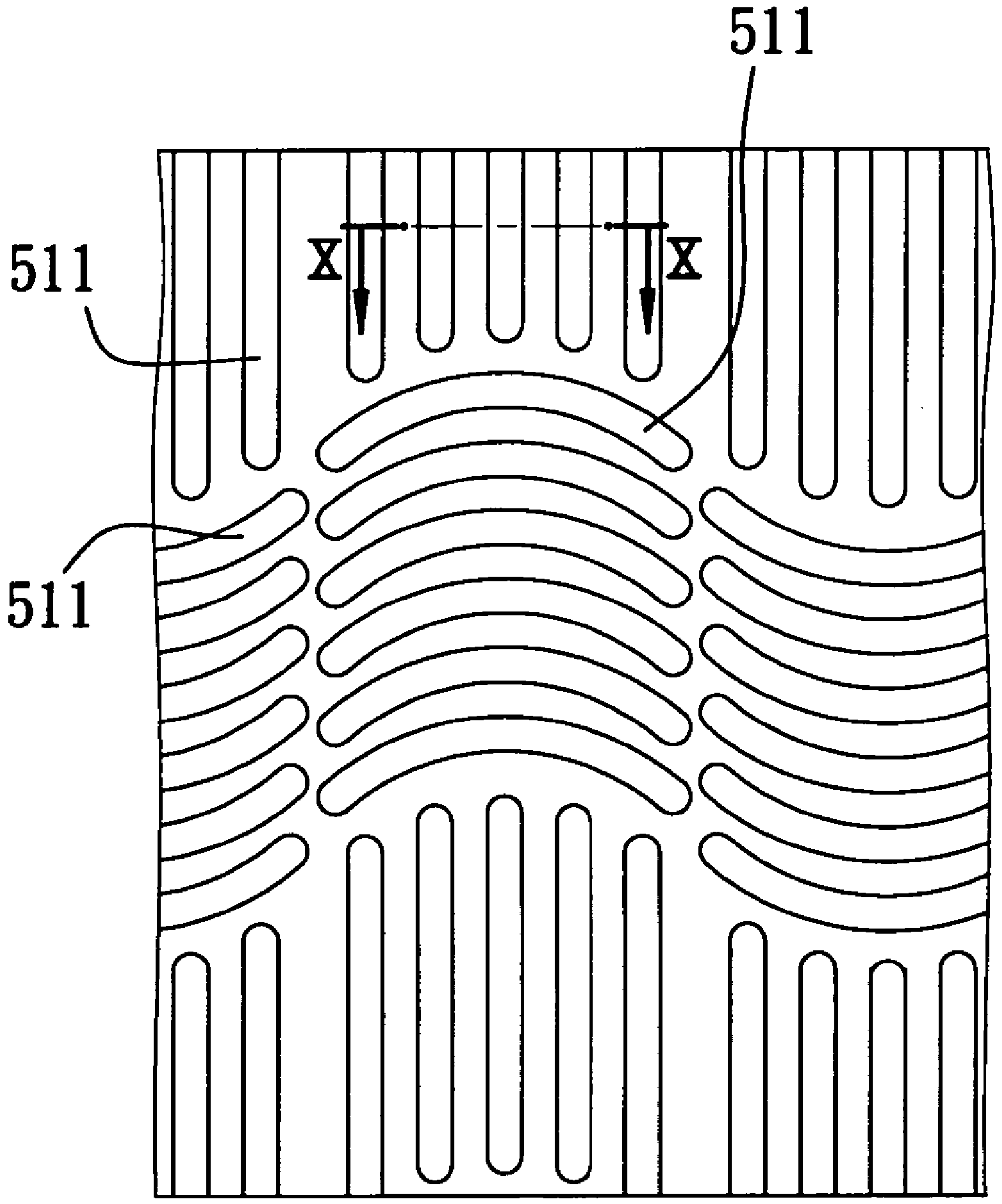
FIG. 9 is a schematic view to illustrate a pattern of micro-cavities that is formed on an article having an optical interfering effect according to this invention.

FIG. 9 illustrates a pattern of micro-cavities 511 formed on an article having an optical interfering effect according to this invention. Each of the micro-cavities 511 is indented inwardly from the surface 51 of the metal substrate 5, and has a concave cross-section.

Figure 10:
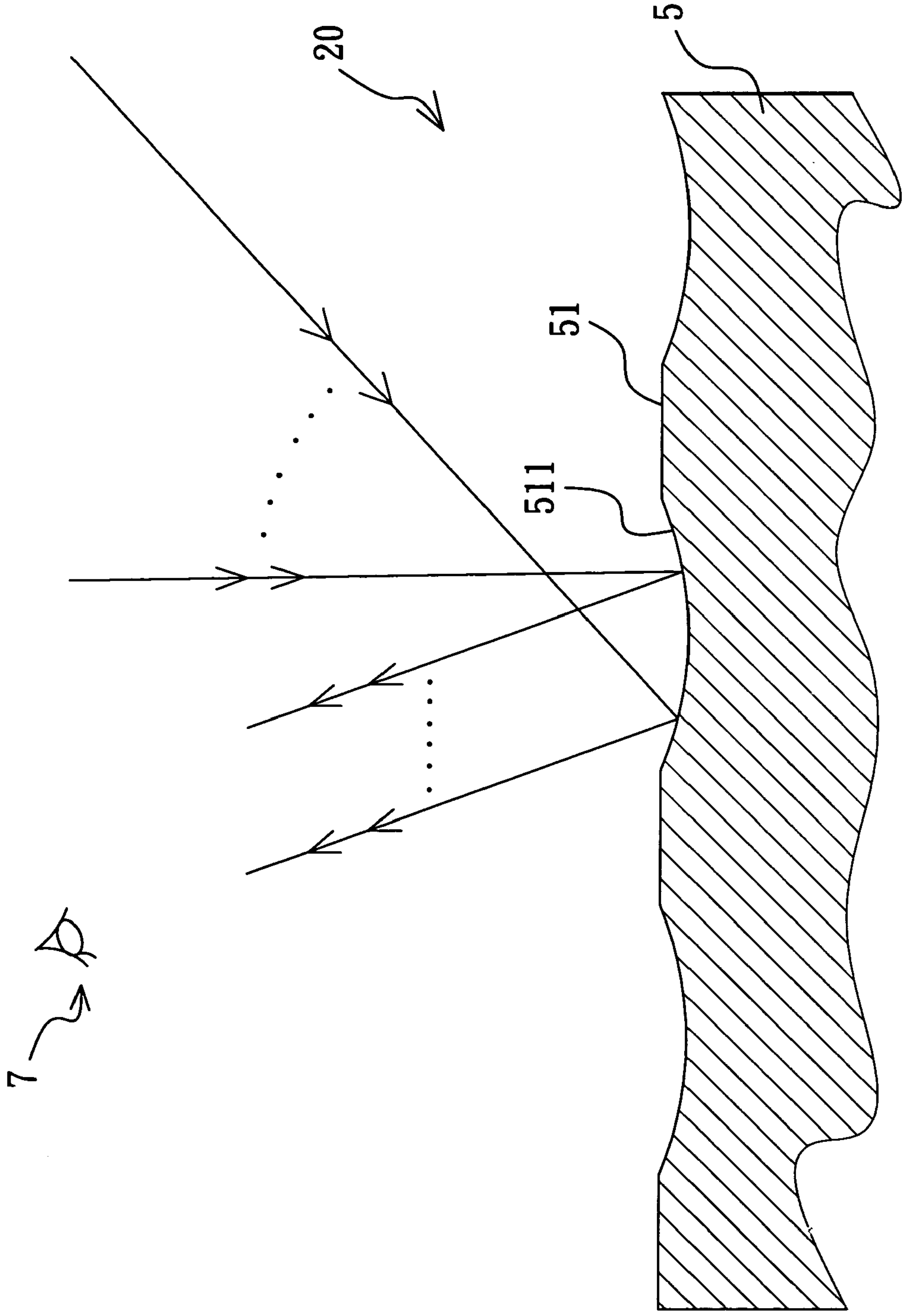
FIG. 10 is a schematic cross-sectional view taken along the line X—X in FIG. 9.

With further reference to FIG. 10, when the surface 51 of the metal substrate 5 of the article according to this invention is observed from any viewing angle, since each of the micro-cavities 511 has a concave cross-section, an extremely wide range of incident light can be reflected into the eyes of an observer 7 with the optical interfering effect on the reflection of the pattern of the micro-cavities 511 by reflecting light that comes from a light source located at any position with respect to the surface 51 of the metal substrate 5.

Therefore, the method for forming an optical interfering pattern on a surface of a metal substrate, and the article having an optical interfering effect according to this invention can overcome the drawbacks of the conventional light-reflecting pattern formed by the cutting tool.

Since the pattern of the micro-cavities 511 is formed by photolithography and wet-etching techniques, the pattern of the micro-cavities 511 can be precisely, productively and economically formed in a wide variety of metal substrates. Thus, the method according to this invention can be used for producing a rainbow hologram based on optical-interference or thin film interference.

In addition, since each of the micro-cavities 511 is indented inwardly from the surface 51 of the metal substrate 5 and has a concave cross-section, an optical interfering effect on the reflection of the pattern can be enhanced.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

I claim:

1. A method for forming an optical interfering pattern on a surface of a metal substrate, comprising the steps of:

(a) patterning the surface of the metal substrate using a mask to identify areas of a pattern of micro-cavities to be etched using photolithography techniques; and (b) wet-etching the metal substrate at the areas of the pattern of the micro-cavities to be etched so as to form the pattern of the micro-cavities, that exhibits an optical interfering effect on the reflection of the pattern of the micro-cavities, in the metal substrate.

2. The method of claim 1, wherein the patterning of the metal substrate comprises:

applying a photoresist layer on the surface of the metal substrate, and patterning the photoresist layer to expose the areas of the pattern of the micro-cavities to be etched.

3. The method of claim 2, wherein the metal substrate is made from aluminum, the etchant used in the wet etching being a ferric chloride solution.

4. The method of claim 3, further comprising depositing a reflection-enhancing metal layer on the surface of the metal substrate after step (b).

5. The method of claim 4, wherein the deposition of the reflection-enhancing metal layer is processed through plating techniques.

6. An article having an optical interfering effect, comprising:

a metal substrate with a surface; and a pattern of micro-cavities formed on said surface of said metal substrate and exhibiting an optical interfering effect on the reflection of said pattern of said micro-cavities;

wherein each of said micro-cavities is indented inwardly from said surface of said metal substrate, and has a concave cross-section.

7. The article of claim 6, wherein each of said micro-cavities is elongated in shape, and has a width ranging from 15–200 μm.

8. The article of claim 7, wherein the distance between two adjacent ones of said micro-cavities ranges from 30–250 μm.

9. The article of claim 7, wherein each of said micro-cavities has a depth less Than half of said width thereof and greater than one-fifteenth of said width thereof.

10. The article of claim 6, further comprising a reflection-enhancing metal layer formed on said surface of said metal substrate.

11. An article having an optical interfering effect, comprising:

a metal substrate with a surface; and a pattern of micro-cavities formed on said surface of said metal substrate and exhibiting an optical interfering effect on the reflection of said pattern of said micro-cavities;

wherein said pattern of said micro-cavities is formed by the following steps: (a) patterning said surface of said metal substrate using a mask to identify areas of said pattern of said micro-cavities to be etched using photolithography techniques; and (b) wet-etching said metal substrate at said areas of said pattern of said micro-cavities to be etched so as to form said pattern of said micro-cavities.

* * * * *